United States Patent [19]
Hönig et al.

[11] 4,410,812
[45] Oct. 18, 1983

[54] VOLTAGE-FREQUENCY CONVERTER

[75] Inventors: Günter Hönig, Ditzingen; Edmund Jeenicke, Schwieberdingen; Immanuel Krauter, Erbstetten; Manfred Schenk, Fellbach, all of Fed. Rep. of Germany

[73] Assignee: Robert Bosch GmbH, Stuttgart, Fed. Rep. of Germany

[21] Appl. No.: 219,136

[22] Filed: Dec. 22, 1980

[30] Foreign Application Priority Data

Dec. 22, 1979 [DE] Fed. Rep. of Germany ....... 2952156

[51] Int. Cl.³ ..................... H03K 3/023; H03K 5/00
[52] U.S. Cl. ................................. 307/350; 307/261; 307/269; 307/271; 328/127; 328/151
[58] Field of Search ............... 307/271, 350, 359, 261, 307/269; 328/127, 128, 150, 151

[56] References Cited
U.S. PATENT DOCUMENTS 3,970,943  7/1976  Chapman et al. .............. 307/271
4,124,821  11/1978  Petr ............................. 307/261

Primary Examiner—John Zazworsky
Attorney, Agent, or Firm—Edwin E. Greigg

[57] ABSTRACT

A voltage-frequency converter having a chargeable and dischargeable memory, a comparator circuit and a subsequent multivibrator, wherein the charging and/or discharging signal for the memory is obtained from special signal sources. At constant charging and discharging signals, a linear voltage-frequency conversion is provided. In the case of variable charging or discharging voltages, non-linear signal conversions are possible. The multivibrator may be a digital monostable multivibrator, to effect precise, reproducible and quantifiable period durations in the output signal of the converter, and thus a very precise voltage-frequency conversion.

4 Claims, 11 Drawing Figures

FIG. 7
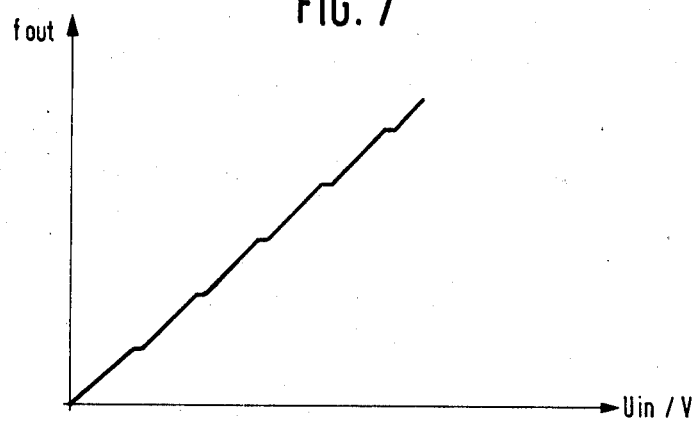
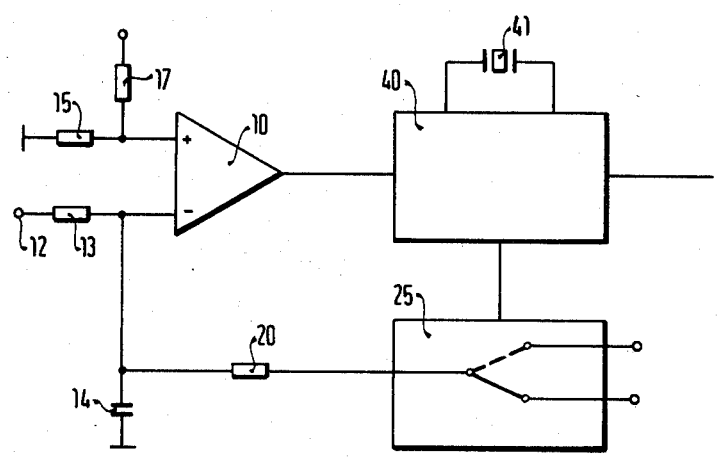
FIG. 8(a)
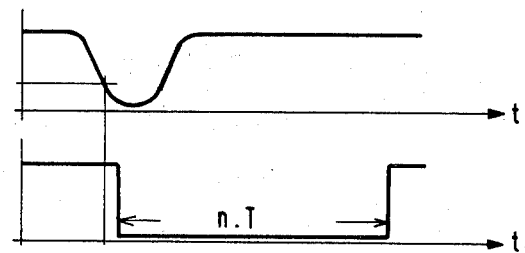
FIG. 8(b)

VOLTAGE-FREQUENCY CONVERTER

BACKGROUND OF THE INVENTION

The invention relates generally to voltage-frequency converters, and more particularly, to a voltage-frequency converter for use in the electric control system of motor vehicles.

In a known voltage-frequency converter, a differential amplifier is used as a comparator. The positive or non-inverting input of the comparator is connected to receive a constant reference signal and the comparator, negative or inverting, input is connected to the input terminal of the converter. The comparator output is connected to the D input of a D flip-flop. The Q output of the D flip-flop is connected via a resistor to the negative input of the comparator. A capacitor, which is used as a storage or memory device, is connected between the comparator negative input and ground. A frequency signal corresponding to an analog input signal supplied to the converter input terminal is present and available for use at the output of the D flip-flop.

The fundamental principle of this known voltage-frequency converter is the alternating charging and discharging of the capacitor, with the frequency of the change in charge being dependent on the input voltage; thus a voltage-frequency conversion is provided.

As a rule, the output signal of the D flip-flop is carried together with a clocking signal to an AND or a NAND gate at the output of which a frequency-controlled signal is then available for use.

The known circuit functions generally satisfactorily. However, it does have its weaknesses wherever the input signal of the comparator must be associated with an absolute, fixed potential as a reference voltage. Problems occur, because in practice the identical reference voltage is very frequently required within a relatively comprehensive system, but fluctuations occur and accordingly problems in adapting levels to one another because of the withdrawal of current from this reference voltage source which is then made. It is true that these problems can be surmounted with a high level of technological expense; however in terms of mass production, these complicated stabilization circuits prove to be too expensive.

OBJECT AND SUMMARY OF THE INVENTION

It is accordingly one of the objects of the invention to create a voltage-frequency converter which is simple in concept, precise and nevertheless favorable in cost, which is universally applicable and with which in addition every desired sort of dynamic systems behavior can be realized.

The voltage-frequency converter according to the invention is similar to the above described known voltage-frequency converter in that it includes a memory device such as a capacitor which can be charged and discharged, a comparator, and a subsequent multivibrator whose output signal controls the charging or discharging of the memory device. However, in the invention described herein, the output of the multivibrator controls a switching device for the charging and discharging signal of the memory device. Since the charging and discharging of the memory device is not determined directly by the multivibrator output voltage, the effect of fluctuations in the reference voltage supplied to the comparator on the converter output frequency signal is minimized. Furthermore, linear and non-linear converters can be realized therewith in a surprisingly simple manner.

It has proved to be particularly advantageous for the multivibrator, which is known from the prior art, to be replaced by a digital monostable multivibrator which operates with a high clock frequency. In that case, an extremely short reaction time, from the output signal of the comparator, which must be clock-synchronized, to the analog switch, can be attained. As a result, frequency locking (a constant frequency over the period of 1 ΔVin) is substantially suppressed.

The invention will be better understood and further objects and advantages thereof will become more apparent from the ensuing detailed description of several preferred embodiments taken in conjunction with the drawings.

BRIEF DESCRIPTION OF THE DRAWING

In the drawings, both the known voltage-frequency converter and various exemplary embodiments of the invention are illustrated.

FIG. 7 is a diagram pertaining to the relationship between the output frequency and the input voltage of the converters shown in FIGS. 2-6;

FIG. 8($a$) is a block circuit diagram of a voltage-frequency converter with a quantified time base;

FIG. 8($b$) is a diagram showing variation of comparator and multivibrator output signals of the converter of FIG. 8($a$) with respect to time;

DESCRIPTION OF THE PREFERRED EMBODIMENTS

Figure 1:
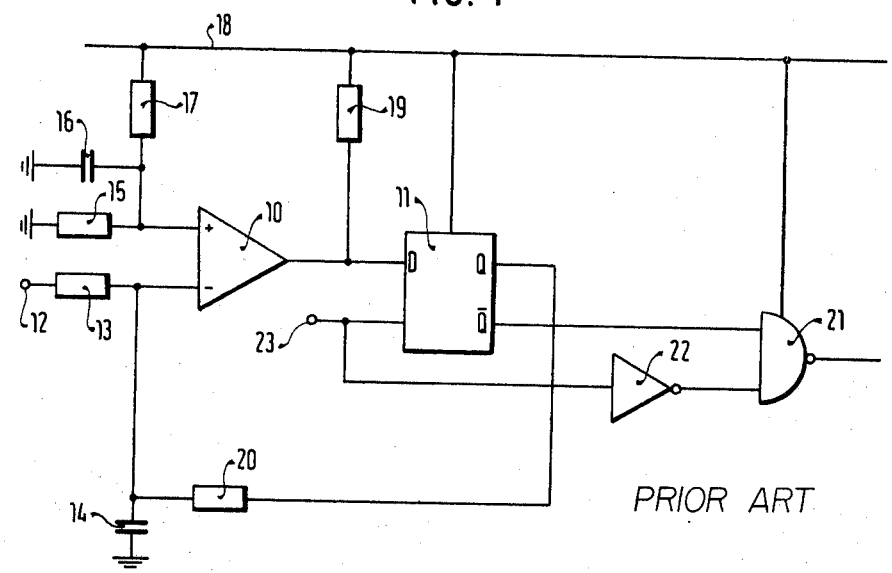
FIG. 1 shows the known voltage-frequency converter.

FIG. 1 shows the voltage-frequency converter which is already known, as noted above. A comparator 10 is shown as well as a D flip-flop 11. One input terminal 12 of the converter is connected via a resistor 13 to the negative (inverting) input of the comparator 10, which in turn is connected to ground via a capacitor 14. The positive (non-inverting) input of the comparator 10 is connected to ground via a parallel circuit comprising the resistor 15 and capacitor capacitor 16 and is also connected to a positive line 18 via a resistor 16. The output of the comparator 10 is connected directly to the D input of a D flip-flop 11, and it is additionally connected to the positive line 18 via a resistor 19. The Q output of the D flip-flop 11, is connected to a negative input of the comparator 10 by a resistor 20. A NAND gate 21 has a first input connected to the $\overline{Q}$ output of the D flip-flop 11 and a second input connected to receive a clock signal from an input terminal 23, via an inverter 22. The D flip-flop is also connected to receive the clock signal from the input terminal 23.

As has already been mentioned in the evaluation of the prior art, the frequency of the change in potential at the output of the D flip-flop 11 corresponds to the analog value of the input voltage present at the input terminal 12. The logic arrangement having the NAND gate 21, which follows the D flip-flop 11, serves to transform the output signal of the D flip-flop 11, which has a relatively low frequency, into a follow-up signal which lends itself well to processing. It is important in the converter of FIG. 1 that the charging or discharging of the capacitor 14 is determined directly by the output potential of the D flip-flop 11. If the voltage-frequency converter is part of a more comprehensive electronic system with high power consumption, then the preparation of stable voltage values is complicated and therefore expensive.

The invention accordingly takes the path of decoupling the charging and discharging processes in the capacitor 14 from the individual circuit elements, such as the D flip-flop 11. As a result, only a reference voltage source of relatively low power, which can be designed in a cost-favorable manner, is then required.

Figure 2:
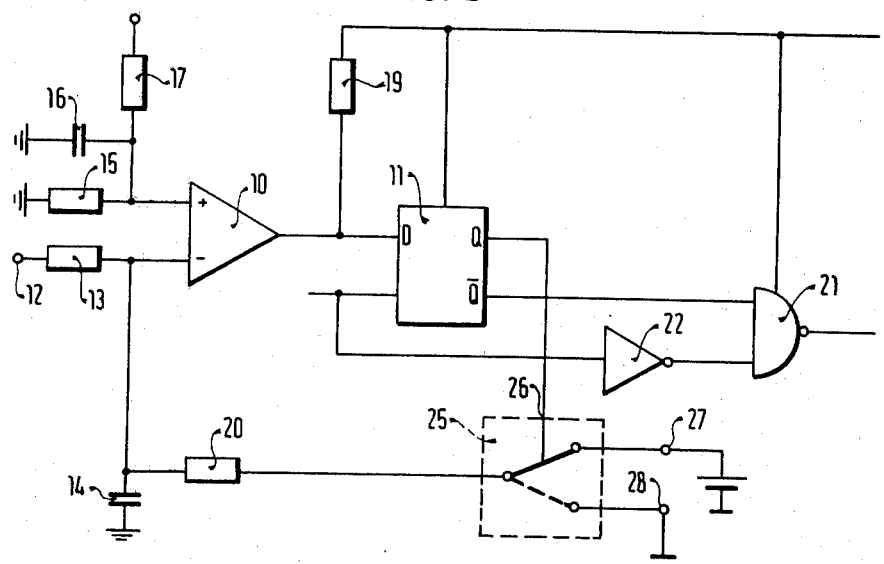
FIGS. 2-6 illustrate various voltage-frequency converters according to the invention.

FIG. 2 shows the realization of this proposal in the form of an electrically-actuated, single pole, double throw reversing switch 25, having a control input 26 connected to the Q output of the D flip-flop 11, an output connected to the resistor 20 and two input terminals 27, 28 connected respectively to a reference voltage potential as well as to ground potential. While in the converter of FIG. 1 the output signal of the D flip-flop 11 thus directly determines the charging or discharging process depending on its value, in the converter of FIG. 2 the D flip-flop 11 controls only various fixed potentials at the resistor 20.

As a result of this decoupling of the output signal of the D flip-flop 11 from the charging and discharging signals for the capacitor 14, arbitrary signal levels are possible at the two input terminals 27 and 28 of the switch 25. Under particular consideration here are non-linear signal circuits in order to provide non-linear voltage-frequency converters.

Figure 3:
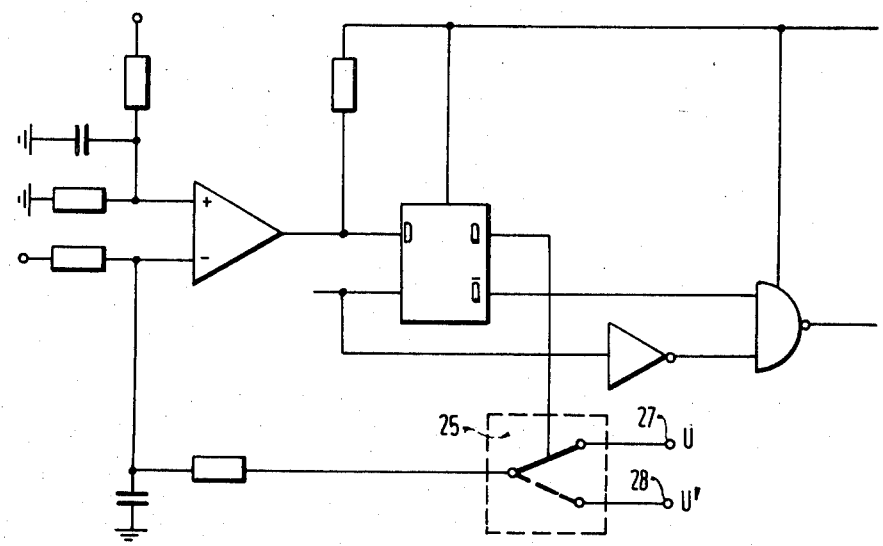

FIG. 3 shows a corresponding proposal, in which the two input terminals 27 and 28 of the switch 25 are indicated as receiving respective arbitrary voltage signals U and U'.

Figure 4:
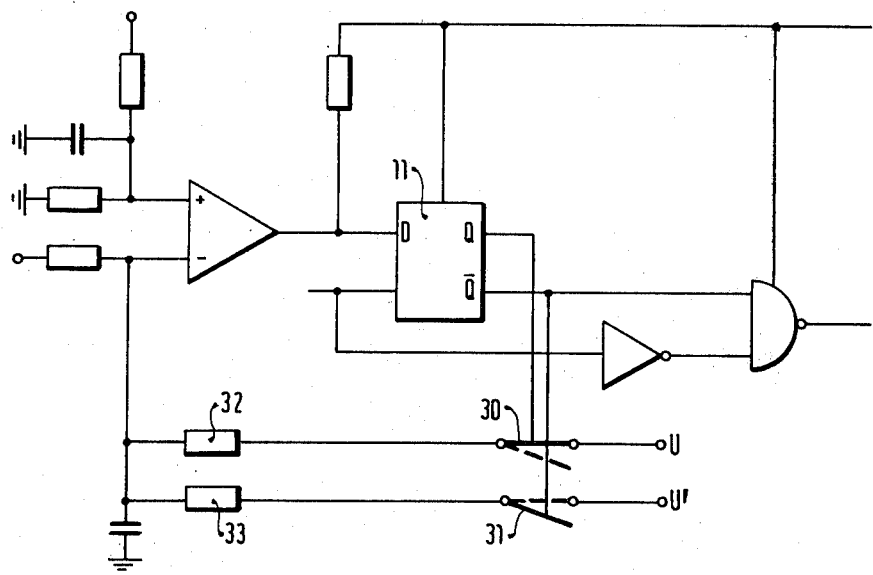

FIG. 4 differs from FIG. 3 in that the switch 25 is not realized as a double-throw switch; it is realized as two electrically-actuated, single-pole, single-throw switches 30 and 31. The switch 30 is actuated by the Q output of the D flip-flop 11 to connect the comparator negative input and the capacitor 14 to the arbitrary voltage U via a resistor 32. The switch 31 is actuated by the $\overline{Q}$ output of the D flip-flop 11 to connect the comparator negative input and the capacitor 14 to the other arbitrary voltage U'.

Figure 5:
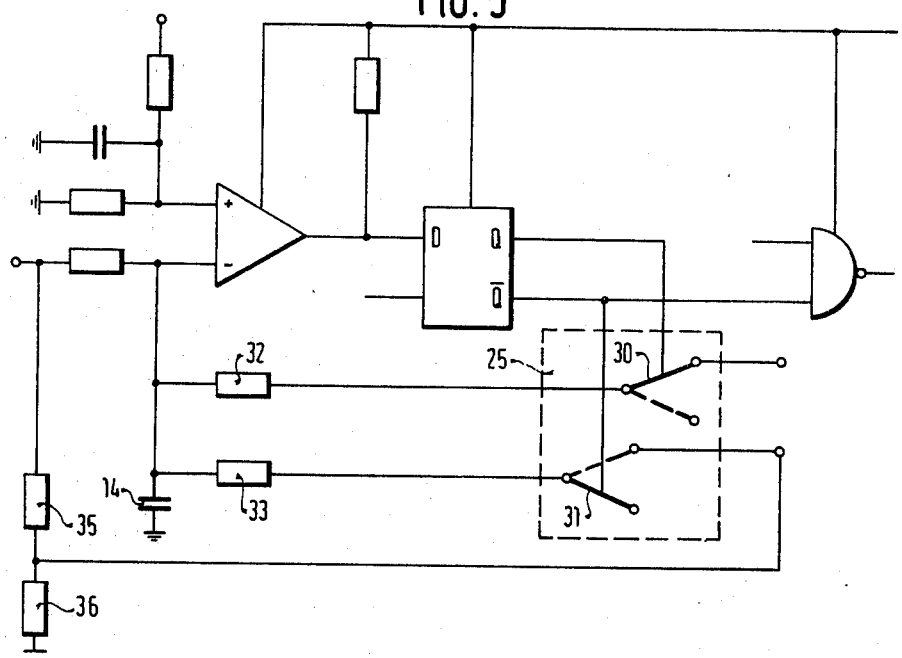

FIG. 5 shows one example for the circuitry of the subject of FIG. 4, for obtaining a non-linear voltage-frequency converter. This is attained in that a voltage divider having two resistors 35 and 36 is connected to ground from the input terminal 12, and the linkage point of the two resistors is connected to the input terminal of the switch 31. In this manner, the discharging current of the capacitor 14 flowing through the resistor 33 is then dependent on the input voltage, which has the effect of imposing a non-linearity on the output signal of the converter.

Figure 6:
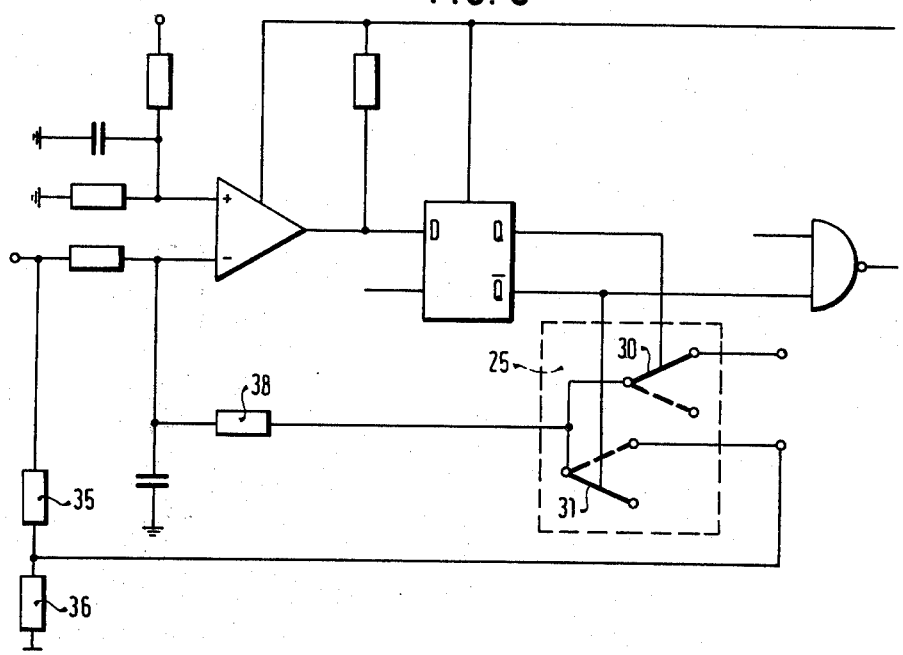

Finally, FIG. 6 shows a variation slightly modified from that of FIG. 5, in which the two resistors 32 and 33 of FIG. 5 are combined into a single resistor 38. The potential at the linkage point of the resistor 38 and the two switches 30 and 31 is also indicated in the circuit diagram and illustrates the influence of this potential, dependent on the two input voltages $V_{ref}$ and $V_{in}$ of the switch 25. By this means, the influence of the parasitic output capacity of the analog switch is eliminated, so long as the analog inputs remain at low impedance. At low levels parasitic capacitors are not very significant.

The examples discussed above of the voltage-frequency converters according to the invention are simple in design and reliable in operation, and furthermore non-linear functions can also be realized between the input and output signal. If it is intended to use them in signal processing systems having a high clock frequency, then there is a small disadvantage in the rigid coupling between the clock signal and the D flip-flop 11 and the actuation of the switch 25. As illustrated in FIG. 7, when the strict association of the input signal and the output signal is not provided for all values, locking points, or so-called "frequency locks", can result. These frequency locks, which are indicated by the heavy lines in FIG. 7 showing the step function, are caused by the fact that, because of the direct relationship between comparator 10 and the D flip-flop 11, the comparator output signal is more or less synchronized with the clock frequency. The problem of the frequency locks occurring in the converters shown in FIG. 7 and described above can be drastically reduced with an apparatus such as that shown in block circuit diagram form in FIG. 8a.

The voltage-frequency converter shown in the form of a block circuit diagram in FIG. 8a has a "digitally quantified time base", which can be realized by means of a monostable multivibrator 40 which functions digitally. In order to quantify this time base signal, there is a quartz-controlled oscillator 41 coupled directly with the multivibrator 40. The rest of the system again corresponds to the converters described above. FIG. 8b shows the operating principle of the circuit arrangement of FIG. 8a. If the output signal of the comparator 10 reverses on the basis of the constant charging procedure of the capacitor 14, then the multivibrator 40 also switches over for a definite time period n·T upon the appearance of the next clock pulse. As a result, the switch 25 is switched into the discharging position for the capacitor 14, and the comparator output value returns again to its outset position. The operating time of the multivibrator 40 continues to run, independently of this. The result is thus a pulsed signal at the multivibrator output having a constant pulse time and a frequency dependent on the input voltage.

Given the selected polarity of the comparator 10, an increasing output frequency results when there is an increasing input voltage. If, in contrast, the reverse proportionality is desired, or if, in general, a reversed relationship is desired, then this can be attained with a different polarity on the part of comparator 10 and a different reference voltage V Ref.

Finally, it is also a characteristic feature of the subject of FIG. 8 that with it, very low frequencies can be generated in association with a definite input voltage. This is based on a correspondingly selected operating time of the multivibrator 40, and this operating time is formed by a multiplicity of clock period times of extremely short duration.

Figure 9:
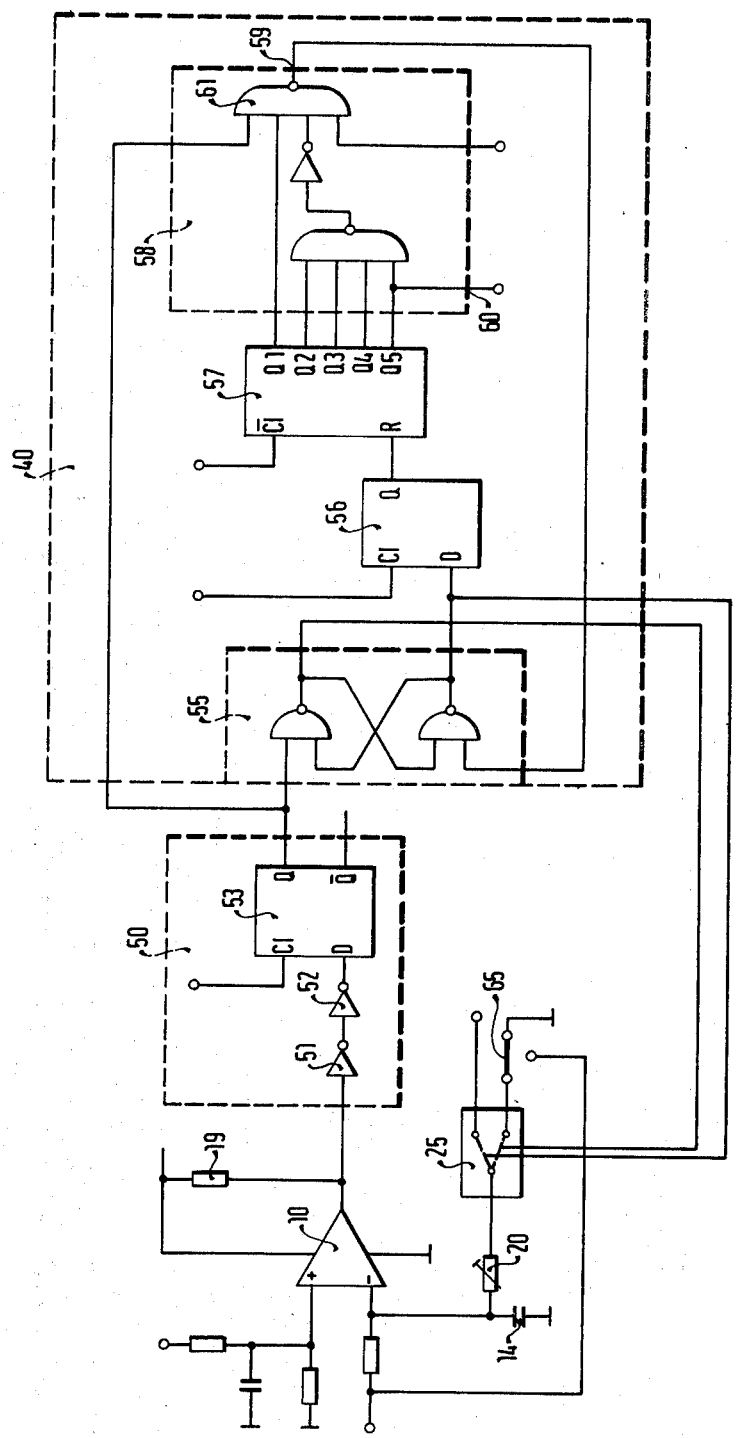
FIG. 9 is a detailed circuit diagram of a voltage-frequency converter with a quantified time base.

One exemplary embodiment of the multivibrator 40 of FIG. 8a is shown in FIG. 9.

As shown in FIG. 9, the comparator 10 is followed by a synchronization circuit having a preceding Schmitt trigger (inverter 51 and 52) as well as a D flip-flop 53. This synchronization circuit 50 is followed by a digital multivibrator 40 having a bistable multivibrator 55, a D flip-flop 56, a counter 57 and a decoder 58. While the first input of the bistable multivibrator 55 is connected to the Q output of the D flip-flop 53, the second input of this multivibrator 55 is connected to an output 59 of the decoder 58. Both outputs Q and Q̄ of the bistable multivibrator 55 are connected to the switch 25 and there serve to provide a corresponding connection of the resistor 20 with two different potentials. The output signal of the voltage-frequency converter can be picked up at a second output 60 of the decoding circuit 58. A NAND gate precedes the output 59, and one input of this NAND gate is coupled with the output Q of the D flip-flop 53 in the synchronization circuit 50. This connection has the purpose of permitting the flip-flop 55, after K (k=1,2, ... 00) monoflop times, to reverse itself once again only if the comparator 10 has previously once again changed its output signal. The two D flip-flops 53 and 56, the counter 57 and the NAND gate 61 are clocked with a very high clock frequency, which is provided by the oscillator 41 shown in FIG. 8 but not shown in FIG. 9.

Figure 10:
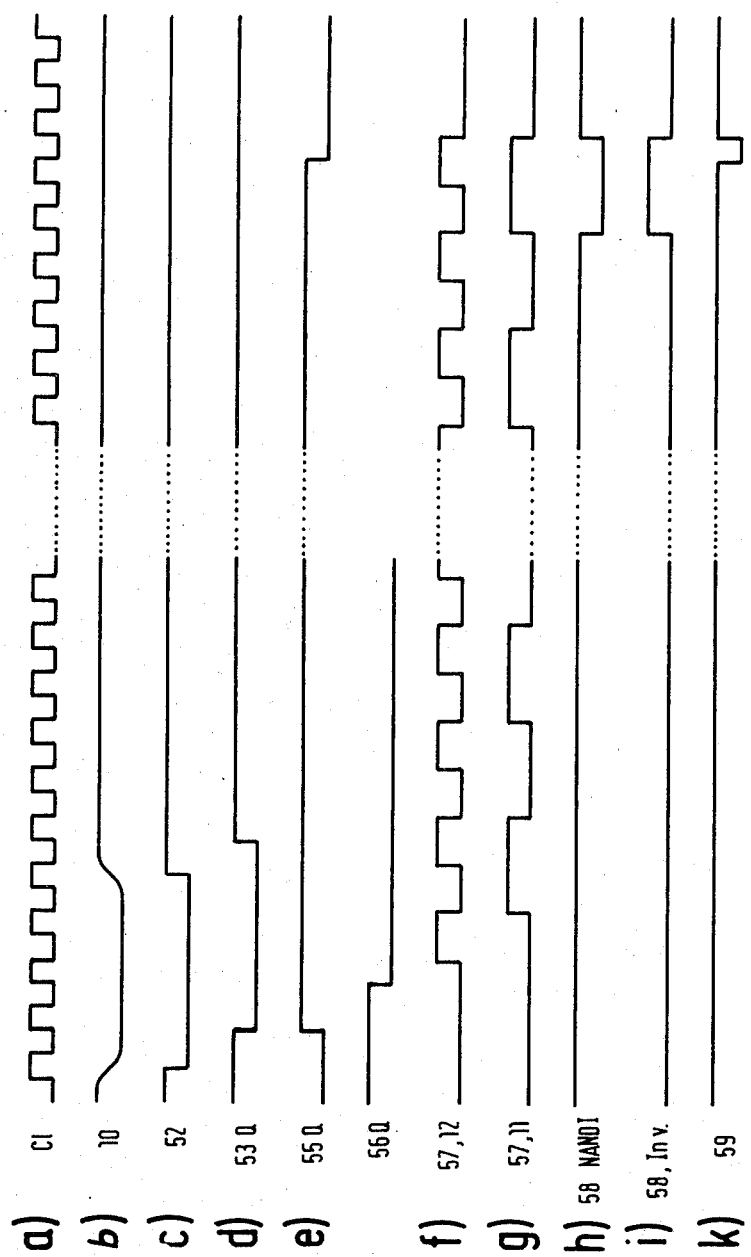
FIG. 10 is a pulse diagram pertaining to the converter of FIG. 9.

The mode of operation of the subject of FIG. 9 will now be explained with the aid of FIG. 10.

As long as the input potential at the negative input of the comparator 10 is smaller than that at the positive input, then the output potential of the comparator 10 will be at a high value (FIG. 10b). As a result, the Q output of the D flip-flop 53 also shows a logical 1 (FIG. 10d), and accordingly the input signal at the subsequent D flip-flop 56 is positive. As a result, the counter 57 remains set back. At the output 60 of the decoding circuit 58, a zero signal is present.

If the input polarity of the comparator 10 is reversed, then its output signal value recedes, the D flip-flop 53 flips back to zero, the output signal of the subsequent D flip-flop 56 also falls to zero, and thus the counter 57, at a predetermined output value, begins counting the clock frequency. Simultaneously, the switch 25 also switches into a new switching position and thus discharges the capacitor 14. If the voltage across the capacitor 14 falls below the potential of the positive input of the comparator, then the comparator output signal again increases, independently of the counting process. It is in particular possible to connect capacitor 14 and resistor 20 to the positive terminal of the amplifier/comparator, FIG. 9, provided the polarity of the enable signal to switch 25 is inverted as well.

If a predetermined counting value is attained in the counter and ascertained by means of the decoding circuit 58, then the flip-flop 55 is again reversed, by means of the signal at the output 59 of the decoding circuit 58, and the entire arrangement is in its outset position once again. A switch 65 at one of the inputs of the switch 25 characterizes the switchover possibility of this discharging signal from a constant value zero to the variable input value or an appropriate fraction thereof. In accordance with this switch position, the result is a linear or non-linear relationship between the input voltage and the output frequency.

As already mentioned at the outset, the above voltage-frequency converters represent very reliable and precise signal converters. At the same time, the design is relatively simple. Their use is envisioned in particular in signal preparation circuits in connection with the control of electrical devices in motor vehicles, such as injection or ignition devices.

The foregoing relates to preferred exemplary embodiments of the invention, it being understood that other embodiments and variants thereof are possible within the spirit and scope of the invention, the latter being defined by the appended claims.

What is claimed and desired to be secured by Letters Patent of the United States is:

1. In a voltage-frequency converter for converting a voltage input signal to a frequency output signal, in particular for use in electric control systems of motor vehicles, wherein the converter includes a memory which can be charged and discharged, a comparator for comparing the charge of the memory with a reference signal and generating an output signal indicating the results of the comparison, and a multivibrator means which functions at a relatively high clock frequency which is connected to receive the comparator output signal and which generates an output signal controlling the charging or discharging of the memory and which comprises a bistable multivibrator, connected by a flip-flop means to a counter, the output of which is connected to a decoder, the improvement which comprises:
  switching means connected to and controlled by the output signal of said bistable multivibrator for supplying charging and discharging signals to the memory, at least one of the charging and discharging signals being a variable or time dependent signal for non-linear, voltage frequency conversion.

2. A voltage-frequency converter as defined by claim 1, wherein said at least one charging and discharging signal is a function of the converter input signal.

3. A voltage-frequency converter as defined by claim 1, further comprising a synchronization circuit disposed between the comparator and the bistable multivibrator.

4. A voltage-frequency converter as defined by claim 1, wherein said switching means comprises a further switching means for switching between a constant value input and an arbitrary value input, whereby a linear or a non-linear relationship between the input voltage and the output frequency of the converter can be established.

* * * * *